US009922932B2

(12) United States Patent
Kawai

(10) Patent No.: US 9,922,932 B2
(45) Date of Patent: Mar. 20, 2018

(54) RESIN STRUCTURE HAVING ELECTRONIC COMPONENT EMBEDDED THEREIN, AND METHOD FOR MANUFACTURING SAID STRUCTURE

(71) Applicant: OMRON CORPORATION, Kyoto-shi, Kyoto (JP)

(72) Inventor: Wakahiro Kawai, Konan (JP)

(73) Assignee: OMRON CORPORATION, Kyoto-shi (JP)

( * ) Notice: Subject to any disclaimer, the term of this patent is extended or adjusted under 35 U.S.C. 154(b) by 0 days.

(21) Appl. No.: 15/128,450

(22) PCT Filed: Mar. 26, 2015

(86) PCT No.: PCT/JP2015/059346
§ 371 (c)(1),
(2) Date: Sep. 23, 2016

(87) PCT Pub. No.: WO2015/163082
PCT Pub. Date: Oct. 29, 2015

(65) Prior Publication Data
US 2017/0103950 A1 Apr. 13, 2017

(30) Foreign Application Priority Data
Apr. 22, 2014 (JP) ................ 2014-088307

(51) Int. Cl.
*H05K 1/18* (2006.01)
*H01L 23/538* (2006.01)
(Continued)

(52) U.S. Cl.
CPC .... *H01L 23/5389* (2013.01); *B29C 45/14819* (2013.01); *H01L 21/565* (2013.01);
(Continued)

(58) Field of Classification Search
CPC ......... H01L 21/02; H01L 21/48; H01L 21/56; H01L 21/60; H01L 21/67; H01L 23/28;
(Continued)

(56) References Cited

U.S. PATENT DOCUMENTS 5,841,192 A * 11/1998 Exposito ................. H01L 21/56
257/701
5,891,758 A * 4/1999 Honda .................. H01L 21/565
174/539
(Continued)

FOREIGN PATENT DOCUMENTS

| CN | 1420537 A | 5/2003 |
| CN | 1499596 A | 5/2004 |

(Continued)

OTHER PUBLICATIONS

The International Search Report dated Jun. 9, 2015 for PCT/JP2015/059346.
(Continued)

*Primary Examiner* — Xiaoliang Chen
(74) *Attorney, Agent, or Firm* — Metrolexis Law Group, PLLC

(57) ABSTRACT

In a resin structure including a resin molded body and a plurality of electronic components embedded in the resin molded body, (i) the resin molded body has a plurality of exposed surfaces on which electrodes of the plurality of electronic components are exposed, (ii) the resin molded body has a recess formed therein, and (iii) the recess has a bottom surface which is at least one of the plurality of exposed surfaces.

10 Claims, 3 Drawing Sheets

(51) Int. Cl.
| | |
|---|---|
| *B29C 45/14* | (2006.01) |
| *H01L 23/00* | (2006.01) |
| *H01L 21/56* | (2006.01) |
| *B29L 31/34* | (2006.01) |
| *B29K 705/10* | (2006.01) |

(52) U.S. Cl.
CPC .............. *H01L 24/19* (2013.01); *H01L 24/24* (2013.01); *H01L 24/48* (2013.01); *B29K 2705/10* (2013.01); *B29L 2031/3481* (2013.01); *H01L 2224/24137* (2013.01); *H01L 2224/24195* (2013.01); *H01L 2224/48101* (2013.01); *H01L 2224/48137* (2013.01); *H01L 2224/48195* (2013.01); *H01L 2924/1815* (2013.01); *H01L 2924/19105* (2013.01)

(58) Field of Classification Search
CPC ......... H01L 23/29; H01L 23/31; H01L 23/48; H01L 23/52; H01L 23/495; H01L 23/498
USPC .......... 361/761; 257/77, 127, 200, 401, 414, 257/635, 659, 666, 668, 676, 686, 690, 257/692, 693, 701, 777, 778, 784; 438/118, 123, 466, 612; 439/676
See application file for complete search history.

(56) References Cited

U.S. PATENT DOCUMENTS

| | | | | |
|---|---|---|---|---|
| 6,002,592 | A | 12/1999 | Nakamura et al. | |
| 6,048,483 | A * | 4/2000 | Miyajima | B29C 45/14655 264/272.14 |
| 6,084,309 | A * | 7/2000 | Kawashima | H01L 21/4835 257/666 |
| 6,114,752 | A * | 9/2000 | Huang | H01L 23/49503 257/666 |
| 6,165,819 | A * | 12/2000 | Seki | H01L 21/4835 134/1.3 |
| 6,204,162 | B1 * | 3/2001 | Yonemochi | H01L 21/4832 257/E23.124 |
| 6,310,390 | B1 * | 10/2001 | Moden | H01L 21/561 257/668 |
| 7,347,737 | B2 * | 3/2008 | Horiba | H01R 13/6464 439/676 |
| 8,535,961 | B1 | 9/2013 | Kuo et al. | |
| 8,581,421 | B2 * | 11/2013 | Shimizu | H01L 23/3128 257/777 |
| 2001/0045636 | A1 * | 11/2001 | Yamaguchi | H01L 23/3107 257/686 |
| 2002/0121650 | A1 * | 9/2002 | Minamio | H01L 21/56 257/200 |
| 2003/0029920 | A1 * | 2/2003 | Chhor | G06K 19/07743 235/492 |
| 2003/0155659 | A1 * | 8/2003 | Verma | G06K 19/072 257/777 |
| 2003/0222344 | A1 * | 12/2003 | Hosoyamada | H01L 23/3128 257/738 |
| 2004/0082100 | A1 | 4/2004 | Tsukahara et al. | |
| 2004/0115864 | A1 | 6/2004 | Sakurai et al. | |
| 2004/0130024 | A1 | 7/2004 | Tsukahara et al. | |
| 2004/0135474 | A1 * | 7/2004 | Koyama | H03H 9/0547 310/348 |
| 2004/0180475 | A1 * | 9/2004 | Shibata | H01L 21/565 438/127 |
| 2005/0093130 | A1 * | 5/2005 | Horie | H01L 23/495 257/693 |
| 2005/0285230 | A1 * | 12/2005 | Kim | H01L 21/4857 257/635 |
| 2006/0113642 | A1 * | 6/2006 | Kajiki | H01L 21/565 257/659 |
| 2006/0138615 | A1 * | 6/2006 | Sato | H01L 23/49548 257/666 |
| 2006/0202793 | A1 * | 9/2006 | Akahoshi | H01L 27/14618 338/34 |
| 2007/0210392 | A1 * | 9/2007 | Sakakibara | B81B 7/007 257/414 |
| 2009/0039523 | A1 | 2/2009 | Jiang et al. | |
| 2009/0101400 | A1 | 4/2009 | Yamakoshi | |
| 2009/0140411 | A1 * | 6/2009 | Masuda | H01L 21/561 257/692 |
| 2010/0133667 | A1 * | 6/2010 | Oka | H01L 23/3735 257/666 |
| 2010/0244214 | A1 * | 9/2010 | Arita | H01L 23/3107 257/676 |
| 2010/0308421 | A1 * | 12/2010 | Muto | H01L 25/074 257/401 |
| 2011/0049531 | A1 * | 3/2011 | Oka | H01L 21/565 257/77 |
| 2011/0081750 | A1 * | 4/2011 | MacHida | H01L 21/4842 438/123 |
| 2012/0326289 | A1 * | 12/2012 | Minamio | H01L 21/565 257/676 |
| 2013/0292852 | A1 | 11/2013 | Fuergut et al. | |
| 2013/0302947 | A1 | 11/2013 | Tao et al. | |
| 2013/0334676 | A1 * | 12/2013 | Kodaira | H01L 23/142 257/690 |
| 2014/0070381 | A1 * | 3/2014 | Doi | H01L 23/3107 257/666 |

FOREIGN PATENT DOCUMENTS

| | | |
|---|---|---|
| JP | H05-055715 A | 3/1993 |
| JP | H07-066570 A | 3/1995 |
| JP | H11-087385 A | 3/1999 |
| JP | 2004-111502 A | 4/2004 |
| JP | 2004-152982 A | 5/2004 |
| JP | 2009-099593 A | 5/2009 |
| JP | 2010-272756 A | 12/2010 |
| TW | 200915525 A | 4/2009 |
| WO | 2008/155957 A1 | 12/2008 |

OTHER PUBLICATIONS

The Taiwanese office action letter dated May 10, 2016 in the counterpart Taiwanese patent application.
The Taiwanese office action letter dated Aug. 19, 2016 in the counterpart Taiwanese patent application.
The English translation of the international preliminary report on patentability (Chapter I) of PCT/JP2015/059346 mailed by the International Bureau of WIPO dated Nov. 3, 2016.
Extended European search report (EESR) dated Nov. 30, 2017 in a counterpart European patent application.

* cited by examiner

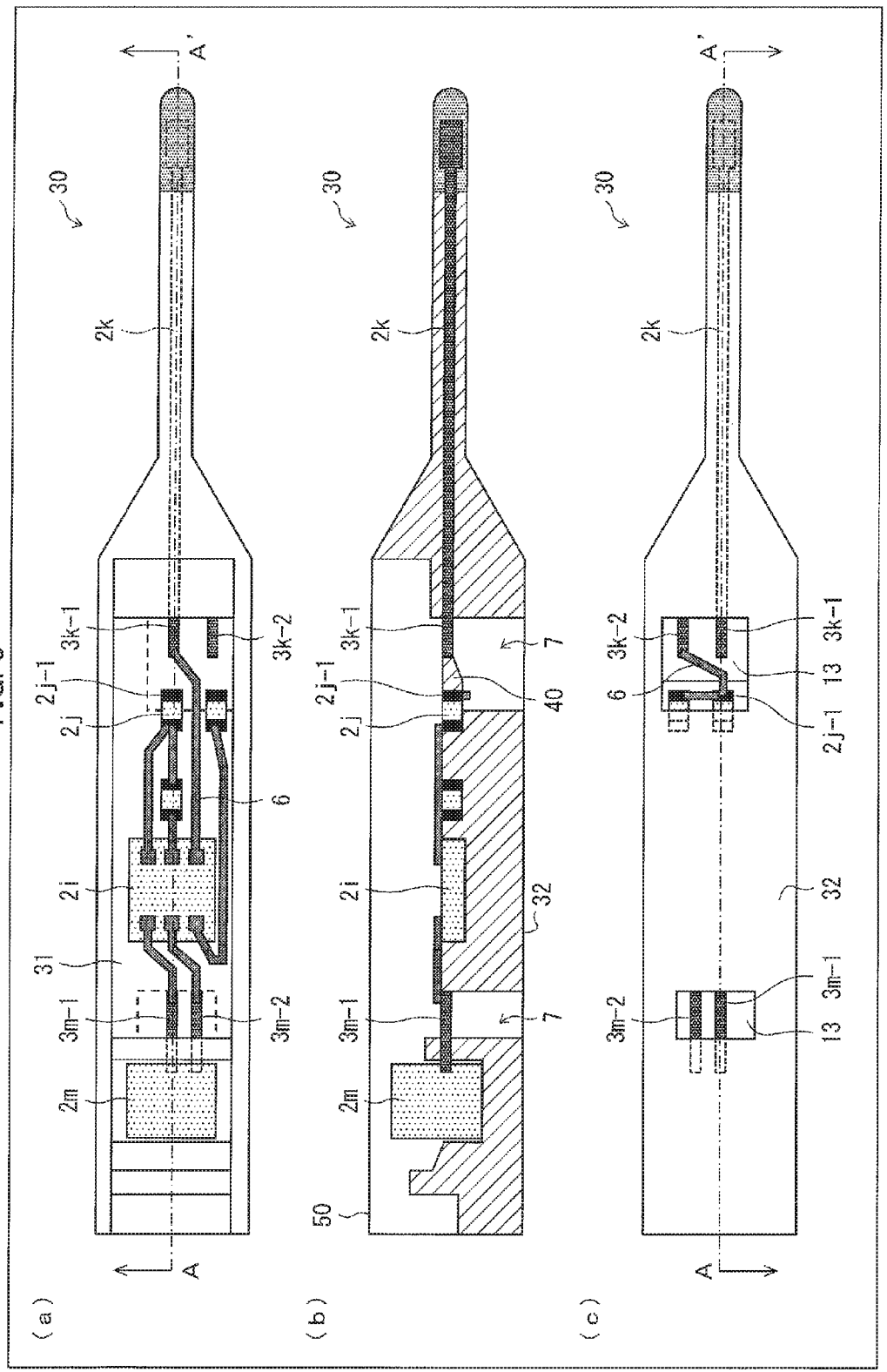

RESIN STRUCTURE HAVING ELECTRONIC COMPONENT EMBEDDED THEREIN, AND METHOD FOR MANUFACTURING SAID STRUCTURE

TECHNICAL FIELD

The present invention relates to a resin structure having an electronic component embedded therein, and a method for manufacturing the resin structure.

BACKGROUND ART

Recently, electronic appliances for consumer use, such as (i) portable electronic appliances such as a mobile phone or (ii) health equipment typified by an electronic thermometer and a sphygmomanometer, face a demand for supply of a thin, light-weight, small, and highly waterproof wearable product at a reasonable price.

In general, the electronic appliances as described above are each configured by assembling various electronic components on a printed circuit board. Note here that examples of the various electronic components include (i) a passive component such as a resistor or a capacitor, (ii) an active component such as an LSI (large scale integrated circuit) or an IC (integrated circuit), (iii) a power supply such as a battery, (iv) a display such as an LED (light emitting diode), and (v) a sensor or a switch.

In general, the printed circuit board is fabricated in such a manner that copper foil is laminated on a sheet of an epoxy resin board (glass epoxy substrate) reinforced with glass fiber or on a sheet of a polyimide substrate (flexible board), and the copper foil laminated is etched so as to form a wiring circuit. Other electronic components are mounted on the wiring circuit with use of solder, a conductive adhesive, a metal wire, or the like to thereby assemble an electronic appliance.

However, the printed circuit board whose circuit is fabricated by etching the copper foil involves a high material cost and a high processing cost, and the mounting of the electronic components with use of the solder, the conductive adhesive, the metal wire, or the like also involves a high material cost and a high processing cost. This makes the electronic appliance expensive. Further, waste fluid discharged during the etching process imposes much damage on the environment.

There is another problem that mounting the electronic components on the printed circuit board requires a certain amount of space between the electronic components, and this results in an increase in thickness of a product obtained and a limitation on downsizing of the product.

To solve these problems, a method for mounting electronic components has been proposed which method uses no printed circuit board in order to achieve reductions in width, size, and cost of a product.

For example, Patent Literature 1 discloses an electronic circuit package in which an electronic component, a circuit element, and the like are embedded in a molded resin such that an electrode surface is exposed. The electronic circuit package is manufactured in the following manner. First, the electronic component, the circuit element, and the like are temporally fixed with use of thermosetting resin. Next, the electronic component, the circuit element, and the like are embedded in the molded resin by injection molding. Then, the resin used for temporally fixing the electronic component, the circuit element, and the like is removed by dissolving, so that the electrode surface is exposed. On the electrode surface thus exposed, a conductor layer is formed and then subjected to exposure and etching, so that a wiring pattern is formed. Thus, the electronic circuit package is manufactured.

Patent Literature 2 discloses a method of using, as an exterior component, a resin in which an electronic component is embedded. According to Patent Literature 2, a circuit is formed by, for example, a technique in which the electronic component is embedded in an inner surface of the resin such that an electrode of the electronic component is exposed, and then silver paste is printed. According to this, the exterior component serves as a substrate, so that no substrate for forming the circuit thereon is necessary. This enables a reduction in width of a product obtained.

Patent Literature 3 discloses an electronic component-mounted device in which an electronic component is embedded in a resin molded article. In the electronic component-mounted device, the electronic component is embedded in the resin molded article such that an electrode of the electronic component is exposed. As such, by electrically connecting the exposed electrode, it is possible to omit (i) a member (substrate) for fixing the electronic component in a state where the electronic component is positioned and (ii) an operation of assembling the electronic component onto a housing.

CITATION LIST

Patent Literatures

[Patent Literature 1]
Japanese Patent Application Publication, Tokukaihei, No. 7-66570 A (Publication Date: Mar. 10, 1995)
[Patent Literature 2]
Japanese Patent Application Publication, Tokukai, No. 2004-111502 A (Publication Date: Apr. 8, 2004)
[Patent Literature 3]
Japanese Patent Application Publication, Tokukai, No. 2010-272756 A (Publication Date: Dec. 2, 2010)

SUMMARY OF INVENTION

Technical Problem

However, according to each of the methods described in the inventions disclosed in Patent Literatures 1 through 3, a circuit for connecting an electronic component and the like can be provided only on one (1) surface on which an electrode is exposed.

This results in a problem that the number and type of mountable electronic components are limited, as well as a problem that a length of a wiring circuit is limited. This reduces flexibility in circuit design.

The present invention is accomplished in view of the foregoing problems. An object of the present invention is to achieve an increased flexibility in designing a circuit for mounting an electronic component, in a resin structure in which the electronic component is embedded in a resin molded body and an electrode of the electronic component is exposed from the resin.

Solution to Problem

A resin structure in accordance with the present invention is a resin structure including: a resin molded body; and a plurality of electronic components embedded in the resin molded body, the resin molded body having a plurality of exposed surfaces on which electrodes of the plurality of electronic components are exposed, the resin molded body having a recess provided therein, the recess having a bottom surface which is at least one of the plurality of exposed surfaces.

According to the configuration, the resin structure includes the plurality of exposed surfaces on each of which an electrode is exposed. This allows providing a circuit on a plurality of surfaces, thereby achieving an increased flexibility in designing a circuit for mounting an electronic component. This increases the number of mountable components, and also solves a problem that in a case where there is only a single surface on which a circuit can be provided, a length of the circuit that connects electronic components is limited.

Advantageous Effects of Invention

The present invention enables an increased flexibility in designing a circuit for mounting an electronic component, in a resin structure in which the electronic component is embedded in a resin molded body.

BRIEF DESCRIPTION OF DRAWINGS

FIG. 3 is a schematic view of a configuration of a resin structure in accordance with Embodiment 2 of the present invention.

DESCRIPTION OF EMBODIMENTS

The following description will discuss an embodiment of the present invention, with reference to drawings.

Embodiment 1

(General Description of Configuration of Resin Structure)

Figure 1:
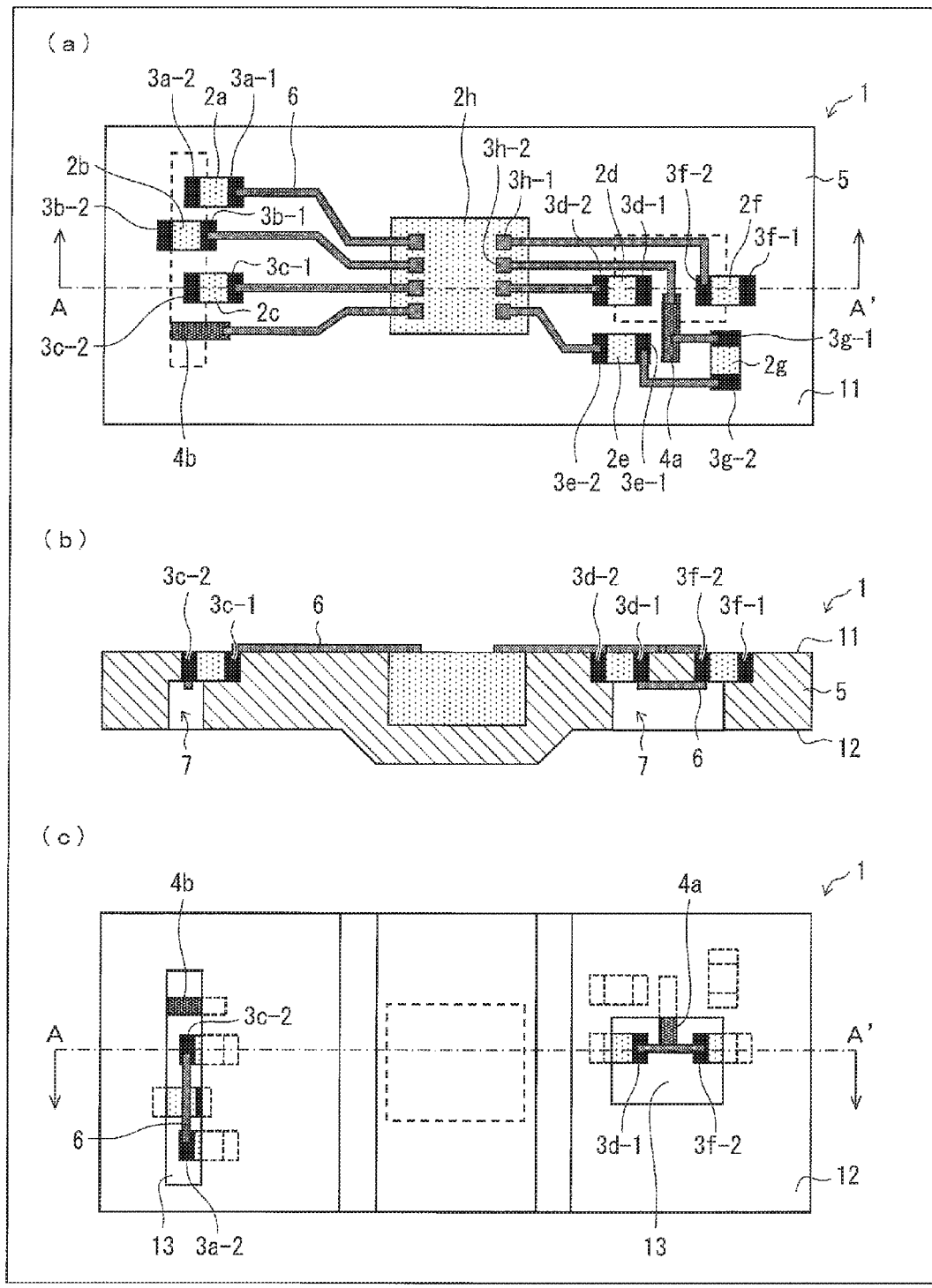
FIG. 1 is a schematic view of a configuration of a resin structure in accordance with Embodiment 1 of the present invention.

FIG. 1 is a schematic view illustrating an exemplary configuration of a resin structure in accordance with Embodiment 1. (a) of FIG. 1 is a schematic view of a configuration of a resin structure 1 in accordance with Embodiment 1 as viewed from above. (b) of FIG. 1 is a cross-sectional view taken along a line A-A' in (a) of FIG. 1. (c) of FIG. 1 is a schematic view of a configuration of the resin structure 1 in accordance with Embodiment 1 as viewed from below.

The resin structure 1 in accordance with Embodiment 1 includes electronic components 2, conductive members 4, a resin molded body 5, and wires 6.

Each of the electronic components 2 (2a through 2h) is (i) a passive component such as a resistor or a capacitor, (ii) an active component such as an LSI or an IC, (iii) a power supply such as a battery, (iv) a display such as an LED, (v) a sensor or a switch, or (vi) the like. Hereinafter, the electronic components are assigned a reference numeral 2 when the electronic components are not distinguished from one another, and each of the electronic components is assigned any of reference numerals 2a through 2h when the electronic components are distinguished from one another.

Each of the electronic components 2 includes any ones of the electrodes 3 (3a-1 through 3h-2). The electronic component 2a includes the electrodes 3a-1 and 3a-2, the electronic component 2b includes the electrodes 3b-1 and 3b-2, the electronic component 2c includes the electrodes 3c-1 and 3c-2, the electronic component 2d includes the electrodes 3d-1 and 3d-2, the electronic component 2e includes the electrodes 3e-1 and 3e-2, the electronic component 2f includes the electrodes 3f-1 and 3f-2, the electronic component 2g includes the electrodes 3g-1 and 3g-2, and the electronic component 2h includes the electrodes 3h-1 and 3h-2. Hereinafter, the electrodes are assigned a reference numeral 3 when the electrodes are not distinguished from one another, and each of the electrodes is assigned any of reference numerals 3a-1 through 3h-2 when the electrodes are distinguished from one another.

The conductive members 4 (4a and 4b) are each a member made of a conductive metal (e.g., copper), and serves as a terminal block for facilitating connection between the electronic components 2. Hereinafter, the conductive members are assigned a reference numeral 4 when the conductive members are not distinguished from each other, and each of the conductive members is assigned either one of reference numerals 4a and 4b when the conductive members are distinguished from each other.

The resin molded body 5 is substantially plate-shaped, and the electronic components 2 and the conductive members 4 are embedded in the resin molded body 5. Note that the resin molded body 5 has a plurality of exposed surfaces on which the electrodes 3 of the electronic components 2 and the conductive members 4 are exposed. Hereinafter, an exposed surface refers to a surface on which one or more electrodes are exposed. In Embodiment 1, a whole of a flat upper surface (hereinafter referred to as "resin molded body upper surface") 11 of the resin molded body 5 serves as one of the plurality of exposed surfaces. The resin molded body 5 has a recess 7 in a lower surface (hereinafter referred to as "resin molded body lower surface") 12 of the resin molded body 5. The recess 7 has a depth that allows an electrode 3 or a conductive member 4 to be exposed. Accordingly, a flat bottom surface (hereinafter referred to as "recess bottom surface") 13 of the recess 7 serves as an exposed surface on which the electrode 3 and the conductive member 4 are exposed.

The resin molded body 5 supports the electronic components 2 so that some (the electrode 3a-2, the electrode 3c-2, the electrode 3d-1, and the electrode 3f-2 in FIG. 1) of the electrodes 3 of the electronic components 2 are two-face exposed electrodes which are each exposed both on the resin molded body upper surface 11 and on the recess bottom surface 13. Similarly, the resin molded body 5 supports the conductive members 4 so that each of the conductive members 4 is exposed both on the resin molded body upper surface 11 and on the recess bottom surface 13.

Each of the wires 6 is (i) a member for connecting between an electrode 3 and another electrode 3, between an electrode 3 and a conductive member 4, or between a conductive member 4 and another conductive member 4 so as to constitute a circuit and (ii) made of a conductive material. Each of the wires 6 (i) is provided on each of the plurality of exposed surfaces on which the electrodes 3 of the electronic components 2 and/or the conductive members 4 are exposed and (ii), on the each of the plurality of exposed surfaces, connects between an electrode 3 and another electrode 3 which are exposed, between an electrode 3 and a conductive member 4 which are exposed, or between a conductive member 4 and another conductive member 4 which are exposed.

As described above, the resin structure 1 has the plurality of exposed surfaces on each of which an electrode and/or a conductive member 4 are/is exposed. This provides an increased flexibility in circuit design as compared with a case in which wiring is arranged only on a single exposed surface.

For example, since, as illustrated in FIG. 1, a wire 6 connecting the conductive member 4a with the electrode 3h-2 is provided on the resin molded body upper surface 11, a wire 6 that connects the electrode 3f-2 with the electrode 3d-1 cannot be provided on the resin molded body upper surface 11. This is because the wire 6 that connects between the electrode 3f-2 and the electrode 3d-1 will intersect with the existing wire 6 between the conductive member 4a and the electrode 3h-2. According to Embodiment 1, however, the resin structure 1 has, apart from the resin molded body upper surface 11, the recess bottom surface 13 on which the electrode 3f-2 and the electrode 3d-2 are exposed. As such, by providing a wire 6 that connects between the electrode 3f-2 and the electrode 3d-1 on the recess bottom surface 13, it is possible to form a circuit.

In the resin structure 1, the two-face exposed electrodes (the electrode 3a-2, the electrode 3c-2, the electrode 3d-1, and the electrode 3f-2 in FIG. 1) (multiple-face exposed electrodes) are exposed both on the resin molded body upper surface 11 and on the recess bottom surface 13. As such, each of the two-face exposed electrodes can be used as a part of wires 6 that connect between a circuit provided on the resin molded body upper surface 11 and a circuit provided on the recess bottom surface 13.

For example, the electrode 3f-2 is a two-face exposed electrode which is exposed on two exposed surfaces, namely, the resin molded body upper surface 11 and the recess bottom surface 13. The electrode 3f-2 is connected by a wire 6 with the electrode 3h-1 on the resin molded body upper surface 11, and connected by a wire with the electrode 3d-1 and the conductive member 4a on the recess bottom surface 13. Accordingly, the wire 6 between the electrode 3h-1 and the electrode 3f-2 provided on the resin molded body upper surface 11 and the wire 6 between the electrode 3d-1, the conductive member 4a, and the electrode 3f-2 provided on the recess bottom surface 13 can be electrically connected with each other without being intermediated by the electronic component 2f. This allows the electrode 3f-2 to be used as a part of the wires 6.

Further, each of the conductive members 4 is also exposed both on the resin molded body upper surface 11 and on the recess bottom surface 13. As such, the conductive members 4 can each be used as a part of wires 6 that connect between a circuit provided on the resin molded body upper surface 11 and a circuit provided on the recess bottom surface 13.

For example, the conductive member 4a is connected by wires 6 with the electrode 3h-2 and the electrode 3g-1 on the resin molded body upper surface 11, and connected by a wire 6 with the electrode 3d-1 and the electrode 3f-2 on the recess bottom surface 13. That is, in a case where a conductive member 4 exposed on both of exposed surfaces (the resin molded body upper surface 11 and the recess bottom surface 13) is embedded in the resin structure 1, a circuit provided on the resin molded body upper surface 11 and a circuit provided on the recess bottom surface 13 can be connected with each other by providing a wire between a conductive member 4 and an electrode 3 on each of the exposed surfaces. This makes it possible to provide a circuit even to electronic components that are arranged in such a manner that it would be difficult to provide the circuit to the electronic components if there is only one surface on which a circuit can be provided. Accordingly, it becomes possible to achieve an increased flexibility in circuit design.

Note that although Embodiment 1 employs a configuration in which each of the conductive members 4 is exposed both on the resin molded body upper surface 11 and on the recess bottom surface 13, the present invention is not limited to such a configuration. A conductive member 4 can be used as a terminal block for connecting between electronic components 2 so as to constitute a circuit, provided that the conductive member 4 is exposed on at least one of the resin molded body upper surface 11 and the recess bottom surface 13.

As described above, it is possible in Embodiment 1 to provide a circuit both on the resin molded body upper surface 11 and on the recess bottom surface 13. This allows a wire to be provided even to electronic components that are arranged in a manner that would conventionally make it difficult to provide a wire to the electronic components. Accordingly, flexibility in positional arrangement of the electronic components is increased.

(Method for Manufacturing Resin Structure)

Figure 2:
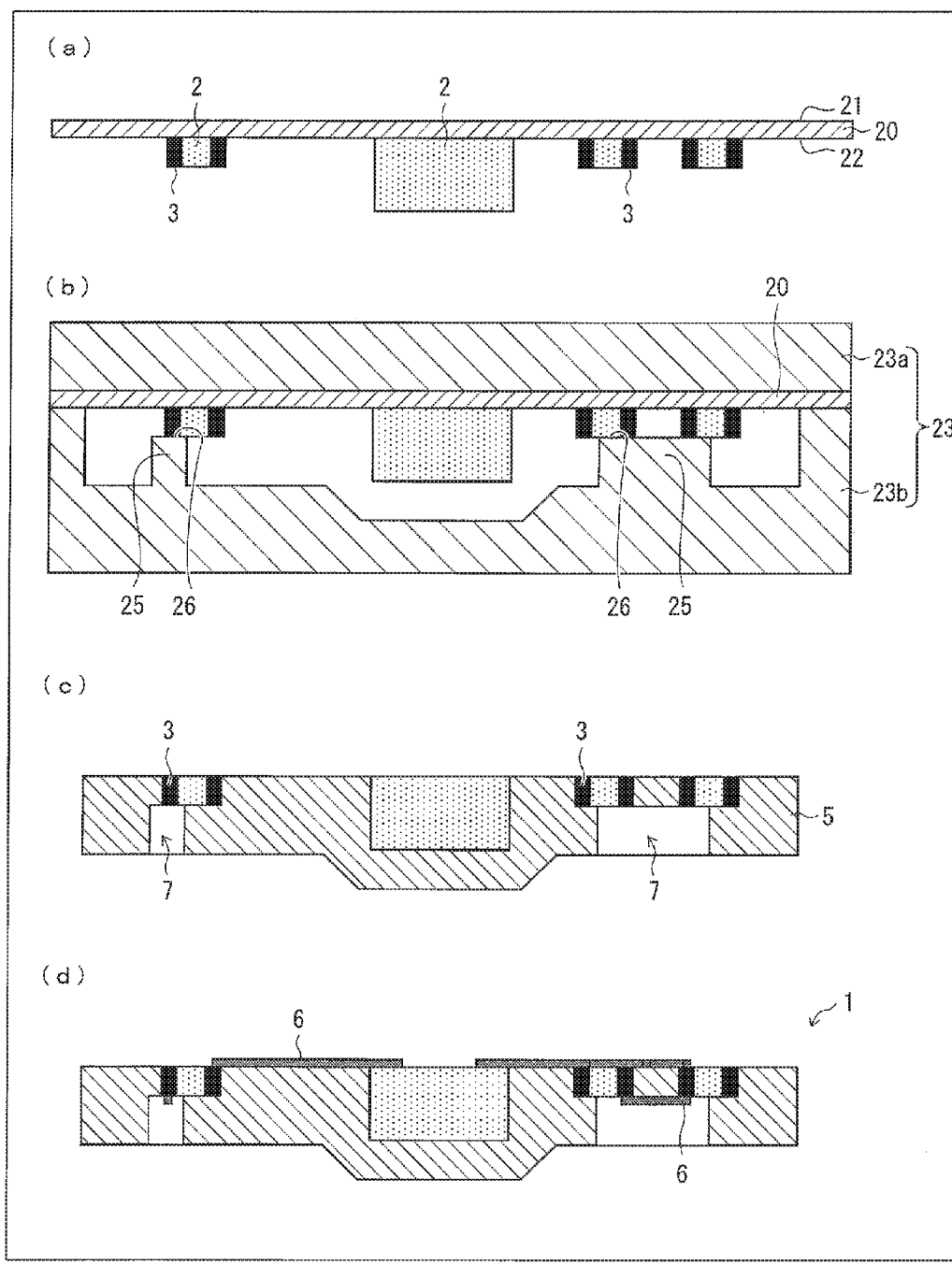
FIG. 2 is a drawing of a manufacturing process of a resin structure in accordance with Embodiment 1 of the present invention.

The following description will discuss, with reference to (a) through (d) of FIG. 2, a method for manufacturing the resin structure 1 in accordance with Embodiment 1.

First, as a first step, the electronic components 2 and the conductive members 4 (not shown in FIG. 2) are bonded and fixed to a sheet 20 so that the electrodes 3 are brought into contact with the sheet 20 ((a) of FIG. 2).

The sheet 20 is preferably made of a material that transmits ultraviolet rays and is flexible. Examples of the material include PET (polyethylene terephthalate), PEN (polyethylene naphthalate), and PPS (polyphenylene sulfide).

Note that the sheet 20 has a surface 22 which is coated with an adhesive. In a state where a positional relation between the electronic components 2 has been decided, the electronic components 2 are fixed to the surface 22 of the sheet 20. The adhesive preferably has a short curing time and can be, for example, an ultraviolet curable adhesive. The ultraviolet curable adhesive is cured by ultraviolet radiation so as to cause the sheet 20 to be bonded with the electronic components 2. As such, in a case where an ultraviolet ray is applied to the surface 22, which is coated with the adhesive, the electronic components 2 themselves become barriers that prevent the adhesive from being irradiated with the ultraviolet ray, so that the curing (bonding) may be insufficiently done. In view of this, the material transmitting ultraviolet rays is employed as the sheet 20, and an ultraviolet ray is applied on a surface 21, which is not coated with the adhesive, of the sheet 20, so that the adhesive is cured sufficiently. This allows the electronic components 2 to be fixed to the sheet quickly and reliably.

Specifically, GL-3005H (manufactured by Gluelabo Ltd.) is used as the ultraviolet curable adhesive, and a PET sheet having a thickness of 50 μm is coated with the adhesive so that the adhesive has a thickness of 2 μm to 3 μm. Subsequently, the electronic components 2 are positioned, and an ultraviolet ray of 3000 mJ/cm$^2$ is applied to the surface 21, not coated with the adhesive, of the sheet. This causes the adhesive to be cured, thereby allowing the electronic components 2 to be fixed.

Next, as illustrated in (b) of FIG. 2, the sheet 20 to which the electronic components 2 are fixed is disposed inside a mold 23 (second step), and the resin molded body 5 which is substantially plate-shaped is molded so that the electronic components 2 are embedded in the resin molded body 5 (third step).

The mold 23 includes a first mold 23a and a second mold 23b. The sheet 20 prepared in the first step is disposed inside a space surrounded by the first mold 23a and the second mold 23b. The first mold 23a has an inner surface that is substantially flat, and the second mold 23b has a protrusion 25 on an inner surface thereof. The sheet 20 is disposed so that a whole of the surface 21 is brought into close contact with the inner surface of the first mold 23a. Further, the sheet 20 is disposed so that at least a part of the electronic components 2 abuts against the protrusion 25 of the second mold 23b and the rest of the electronic components 2 is spaced apart from the second mold 23b. Then, the resin molded body 5 is molded by injection molding.

Note that the protrusion 25 has a flat upper surface and is provided in a position that allows the protrusion 25 to abut against an electrode 3 of an electronic component 2 and/or a conductive member 4 which are/is to be exposed on the recess bottom surface 13. Accordingly, when the resin molded body 5 is taken out of the mold 23, a part (abutment part 26) where the protrusion 25 and the electronic component 2 abut against each other is exposed from the resin molded body 5. That is, the protrusion 25 corresponds to the recesses 7 of the resin molded body 5, and an upper surface of the protrusion 25 corresponds to the recess bottom surface 13, which is an exposed surface of the resin molded body 5. Thus molding the resin molded body 5 with use of the second mold 23b having the protrusion 25 eliminates the need for a processing step for forming the recesses 7 after molding the resin molded body 5. This allows reducing the number of production steps and production cost.

Note here that it is preferable that the abutment part 26 of the electronic component 2 which abuts against the protrusion 25 of the second mold 23b be a portion of the electronic component 2 which portion includes the electrode 3 of the electronic component 2. This is for the following reason. That is, since the abutment part 26 is a portion of the electronic component 2 which portion includes the electrode 3, the electrode 3 is exposed from the recess bottom surface 13 of the resin molded body 5 but the rest of the electronic component 2 is not exposed from the resin molded body 5. This allows the electronic component 2 to be reliably fixed in the resin molded body 5.

As for specific conditions for the molding, the injection molding can be carried out with use of a resin such as ABS resin as a material of the resin molded body 5 and under a molding temperature of 80° C., an injected resin temperature of 180° C., and an injection pressure of 20 kgf/cm².

Next, as a fourth step, the resin molded body 5 is taken out of the mold 23 and the sheet 20 is peeled off ((c) of FIG. 2).

As a result, the electrodes 3 are exposed on the resin molded body upper surface 11, which corresponds to the surface 22 of the sheet 20, and the resin molded body upper surface (first exposed surface) 11 becomes an exposed surface.

Note here that in a case where (i) the adhesive employed in the first step has a property of softening at the molding temperature of the third step and (ii) the sheet 20 employed in the first step is suitably flexible in order to be peeled off, the sheet 20 can be peeled off easily.

In the resin molded body 5, the recess 7 is formed in a position corresponding to the protrusion 25 of the mold 23, and the recess bottom surface (second exposed surface) 13 on which an electrode 3 and/or a conductive member 4 are/is exposed is formed as an exposed surface.

Lastly, as a fifth step, wires 6 are formed on the exposed surfaces, each of which wires 6 connects between electrodes 3 that are exposed on the each of the exposed surfaces, between an electrode 3 and a conductive member 4 that are exposed on the each of the exposed surfaces, or between conductive members 4 that are exposed on the each of the exposed surfaces ((d) of FIG. 2).

A preferable method for forming the wires 6 is a method (e.g., ink jet printing etc.) of printing the wires 6 by injecting a conductive material (e.g., silver ink etc.). Each of the exposed surfaces (the resin molded body upper surface 11 and the recess bottom surfaces 13) formed in the fourth step is a flat surface. Accordingly, wires 6 having highly reliable connectivity can easily be formed by injection of the conductive material, so that the electronic components 2 can be electrically connected.

The resin structure 1, in which the electronic components 2 are embedded in the resin molded body 5, has a problem that the electronic components 2 are misaligned due to an extrusion pressure of the resin at the time of molding of the resin molded body 5. In Embodiment 1, even in a case where the electronic components 2 embedded in the resin molded body 5 are misaligned from their predetermined positions, the employment of the above-described method as the method for forming the wires allows detecting, at the time of printing the wires 6, the positions of the electrodes 3 by use of a method such as image processing, so that the wires 6 can be printed in accordance with the misalignment. This allows securing sufficient area for the electrodes 3 and the wires 6 to be grounded, and providing a highly reliable circuit, accordingly.

Modified Example 1

The following description will discuss a modified example of the resin structure 1 in accordance with Embodiment 1.

In the resin structure 1 having the configuration illustrated in FIG. 1, the conductive members 4 are embedded in the resin molded body 5. The resin structure 1, however, does not have to have the conductive members 4 embedded therein. The conductive members 4 can be omitted, for example, in a case of a circuit in which the number of the electronic components 2 is relatively small, or in a case of such circuits that a circuit on the resin molded body upper surface 11 and a circuit on the recess bottom surface 13 can be connected with each other with use of, as described above, a two-face exposed electrode instead of a conductive member 4.

Embodiment 2

The following description will discuss an embodiment of a case in which the resin structure in accordance with the present invention is applied to an electronic thermometer. Note that, for easy explanation, the same reference signs will be given to members each having a similar function as a member described in Embodiment 1, and descriptions on such a member will be omitted.

FIG. 3 is a schematic view of a resin structure 30 in accordance with Embodiment 2. (a) of FIG. 3 is a schematic view of a configuration of the resin structure 30 in accordance with Embodiment 2 as viewed from above. (b) of FIG. 3 is a cross-sectional view taken along a line A-A' in (a) of FIG. 3. (c) of FIG. 3 is a schematic view of a configuration of the resin structure 30 in accordance with Embodiment 2 as viewed from below.

The resin structure 30 in accordance with Embodiment 2 is configured such that (i) a passive device such as a resistor or a capacitor, (ii) an active device such as an IC or an LSI, (iii) a thermistor 2*k* which is a temperature detector, (iv) a battery 2*m*, and (v) the like are embedded in a resin molded body 5 as electronic components 2. Electrodes 3 exposed from the resin structure 30 are connected by wires 6 so as to constitute circuits. Note that the electrodes 3 include electrodes 3*k*-1 and 3*k*-2 of the thermistor 2*k* and electrodes 3*m*-1 and 3*m*-2 of the battery 2*m*.

The resin structure 30 in accordance with Embodiment 2 also includes a recess 7 in a resin molded body lower surface 32, as with the resin structure 1 described in Embodiment 1. A recess bottom surface 13 and a resin molded body upper surface 31 serve as exposed surfaces on which the electrodes 3 of the electronic components 2 are exposed. Note that each of the electrodes 3*k*-1 and 3*k*-2 of the thermistor 2*k* is a two-face exposed electrode that is exposed both on the resin molded body upper surface 31 and on the recess bottom surface 13. This allows a circuit to be provided both on the resin molded body upper surface 31 and on the recess bottom surface 13.

Specifically, as illustrated in FIG. 3, the electrode 3*k*-1, which is one of the electrodes of the thermistor 2*k*, is connected by a wire 6 with the electronic component 2*i* on the resin molded body upper surface 31. The electrode 3*k*-2, which is the other of the electrodes of the thermistor 2*k*, is connected by a wire 6 with the electronic component 2*j* on the recess bottom surface 13. By thus employing a configuration in which both of the electrode 3*j*-1 of the electronic component 2*j* and the electrode 3*k*-2 of the thermistor 2*k* are exposed on the exposed surface provided on the recess bottom surface 13, it is possible to provide a wire 6 between electrodes 3 on the recess bottom surface 13, which serves as another exposed surface other than the resin molded body upper surface 11, even in a case where it is difficult to provide a wire 6 between the electrodes 3 on the resin molded body upper surface 11.

In a case where a thickness of the electrode 3*k*-1 of the thermistor 2*k* is different from that of the electronic component 2*j*, an inclined surface 40 is provided on the recess bottom surface 13 so that the electrode 3*k*-1 of the thermistor 2*k* and the electrode 3*j*-1 of the electronic component 2*j* are each exposed both on the resin molded body upper surface 31 and on the recess bottom surface 13. This allows wires 6 to be printed so as to form a circuit, even in a case where the thickness of the electrode 3*k*-1 of the thermistor 2*k* is different from that of the electronic component 2*j*. Accordingly, an increased flexibility in circuit design is achieved. Note that the inclined surface 40 is simply inclined with respect to the resin molded body lower surface 32, and not perpendicular to the resin molded body lower surface 32. This allows wires having highly reliable connectivity to be provided on the inclined surface 40 even in a case where the wires are printed by a method (e.g., ink jet printing etc.) in which a conductive material is injected.

The electrodes 3*m*-1 and 3*m*-2 of the battery 2*m* embedded in the resin structure 30 are also embedded in the resin structure 30 as two-face exposed electrodes that are each exposed on both the exposed surfaces of the resin molded body upper surface 31 and the recess bottom surface 13, similarly as the electrodes 3*k*-1 and 3*k*-2 of the thermistor 2*k* described above. This allows a wire 6 to be provided on both the exposed surfaces, and also allows the electrodes 3*m*-1 and 3*m*-2 to be used as a part of wires 6 that connect between a circuit on the resin molded body upper surface 31 and a circuit on the recess bottom surface 13. This enables an increased flexibility in circuit design.

Further, a sealing body 50 is assembled onto the resin structure 30 on an upper surface side of the resin structure 30, and the resin structure 30 is sealed by a means such as an adhesive, ultrasonic welding, or pouring a resin into a mold, so that an electronic thermometer is manufactured. This allows the electronic components 2, the electrodes 3, the wires 6, and the like, which are exposed, to be shielded from an external environment and accordingly, allows an inside of the resin structure 30 to be protected from water, moisture, and the like. The recess bottom surfaces 13 can be sealed by a similar means. Or alternatively, the electrodes 3*m*-1 and 3*m*-2 of the battery 2*m* described above can be left exposed from the resin structure 30 so as to serve as electrodes to be used when charging or the like is carried out. In this case, no wire 6 is provided on the recess bottom surface 13 that is an exposed surface on which the electrodes 3*m*-1 and 3*m*-2 are exposed.

As described above, in a case where the resin structure 30 is used as an exterior component of an electronic device such as a thermometer, no fixing member for fixing an electronic component such as a substrate is necessary. This eliminates restrictions on the exterior component which are otherwise given in connection with a positional arrangement of a fixing member such as a substrate. Accordingly, the use of the resin structure as the exterior component of the electronic device allows reducing an influence of the positional arrangement of the electronic component to an appearance of the electronic device.

The present invention is not limited to the embodiments, but can be altered by a skilled person in the art within the scope of the claims. An embodiment derived from a proper combination of technical means each disclosed in a different embodiment is also encompassed in the technical scope of the present invention.

[Conclusion]

As described above, a resin structure in accordance with the present invention is a resin structure including: a resin molded body; and a plurality of electronic components embedded in the resin molded body, the resin molded body having a plurality of exposed surfaces on which electrodes of the plurality of electronic components are exposed, the resin molded body having a recess provided therein, the recess having a bottom surface which is at least one of the plurality of exposed surfaces.

According to the configuration, the resin structure includes the plurality of exposed surfaces on each of which an electrode is exposed. This allows providing a circuit on a plurality of surfaces, thereby achieving an increased flexibility in designing a circuit for mounting an electronic component. This increases the number of mountable components, and also solves a problem that in a case where there is only a single surface on which a circuit can be provided, a length of the circuit that connects electronic components is limited.

Further, the resin structure in accordance with the present invention can be configured such that the resin structure further includes a wire provided on each of the plurality of exposed surfaces, the wire connecting between the electrodes exposed on the plurality of exposed surfaces.

According to the configuration, each wire is provided on a single surface, as opposed to a configuration in which a wire is provided so as to extend over two surfaces (three-dimensional wiring) which, for example, perpendicularly intersect with each other. As such, in a case where the resin molded body undergoes deforming force such as expansive force, contractile force, or bending force, a wire of the three-dimensional wiring (in general, a part of the wire which part is bending 90 degrees) tends to get broken by deforming force, whereas according to the resin structure in accordance with the present invention in which each wire is provided on a single surface, it is possible to provide a circuit which hardly undergoes a breaking of a wire and therefore is highly reliable.

Further, the resin structure in accordance with the present invention can be configured such that at least one of the electrodes is a multiple-face exposed electrode which is exposed on at least two exposed surfaces that are different from each other, the resin structure further including a wire provided on each of the at least two exposed surfaces, the wire being connected with the multiple-face exposed electrode.

According to the configuration, it is possible to provide a circuit by assuming that the multiple-face exposed electrode is a wire that connects between the at least two exposed surfaces. This enables an increased flexibility in circuit design.

Further, the resin structure in accordance with the present invention can be configured such that at least one of the at least two exposed surfaces is a bottom surface of the recess.

According to the configuration, in a case where an exposed surface on which the multiple-face exposed electrode is exposed is provided on the bottom surface of the recess, it is possible to provide a circuit also on the bottom surface of the recess, and also provide a circuit by assuming that the multiple-face exposed electrode is a part of a wire that connects between the bottom surface of the recess and the other exposed surface.

Further, the resin structure in accordance with the present invention can be configured such that only a part of an electronic component whose electrode is exposed on the bottom surface of the recess among the plurality of electronic components is exposed on the bottom surface.

According to the configuration, in a case where only a part of an electronic component is exposed on the recess of the resin molded body, the rest of the electronic component is covered in the resin structure. This allows the electronic component to be reliably fixed in the resin molded body.

Note that the resin structure in accordance with the present invention can be configured such that: the resin molded body is substantially plate-shaped; one surface of the resin molded body is a flat surface, a whole of which is one of the plurality of exposed surfaces; and the other surface of the resin molded body has the recess provided thereon.

Further, the resin structure in accordance with the present invention can be configured such that the resin structure further includes: a conductive member embedded in the resin molded body and exposed on at least one of the plurality of exposed surfaces; and a wire provided on the at least one of the plurality of exposed surfaces, the wire connecting the conductive member with an electrode of an electronic component that is exposed on the at least one of the plurality of exposed surfaces.

According to the configuration, in a case where the conductive member is exposed from an exposed surface, the conductive member can be used as a terminal block for connecting between electrodes.

Further, the resin structure in accordance with the present invention can be configured such that the resin structure further includes: a conductive member embedded in the resin molded body and exposed on at least two of the plurality of exposed surfaces; and a wire provided on each of the at least two of the plurality of exposed surfaces, the wire being connected with the conductive member.

According to the configuration, in a case where the conductive member is exposed from at least two exposed surfaces, it is possible to provide a circuit by assuming that the conductive member is a part of a wire that connects between the two exposed surfaces. This enables an increased flexibility in positional arrangement of a circuit.

Further, the resin structure in accordance with the present invention can be configured such that the resin structure further includes a sealing body for sealing the plurality of exposed surfaces.

According to the configuration, the electronic components, the electrodes, the wires, and the like, which are exposed, can be shielded from an external environment, and an inside of the resin structure can be protected from water, moisture, and the like, accordingly.

Further, a method, in accordance with the present invention, for manufacturing a resin structure is a method for manufacturing a resin structure including a resin molded body and a plurality of electronic components embedded in the resin molded body, the method including: a first step of bonding a sheet to the plurality of electronic components so that the sheet abuts against electrodes; a second step of disposing the sheet to a mold so as to create a space between (i) a surface of the sheet to which surface the plurality of electronic components are bonded and (ii) an inner surface of the mold; a third step of filling the space with a resin to thereby mold the resin molded body in which the plurality of electronic components are embedded; and a fourth step of taking the resin molded body out of the mold and peeling the sheet off the resin molded body, thereby providing, on the resin molded body, a first exposed surface on which the electrodes which have been abutting against the sheet are exposed, the mold having a protrusion on the inner surface thereof, the second step including disposing the sheet to the mold so as to cause the protrusion to abut against the electrodes, so that the fourth step includes providing a second exposed surface on which the electrodes which have been abutting against the protrusion are exposed.

According to the configuration, it is possible to manufacture the resin molded body which includes, as exposed surfaces on which the electrodes of the plurality of electronic components are exposed, the first exposed surface (a surface from which the sheet is peeled off) and the second exposed surface (a surface against which the protrusion of the mold has been abutting). This makes it possible to manufacture a resin structure which allows a high level of flexibility in circuit design.

Further, the method in accordance with the present invention can be configured such that the method further includes a fifth step of performing printing by injecting a conductive material both on the first exposed surface and on the second exposed surface, thereby providing wires connecting between the electrodes which are exposed.

According to the configuration, it is possible to form circuits by a simple method, such as ink jet printing, in which printing is performed by injecting a conductive material on each of the first exposed surface and the second exposed surface. This allows reducing a material cost and a processing cost as compared with a method in which wires are formed by etching etc. Further, in the method in which printing is performed by injection of a conductive material, adjustment of printing positions is generally easy to perform. As such, even in a case where an electronic component is embedded in a position misaligned from a predetermined position, it is possible to form a wire in accordance with the misalignment.

Further, the method in accordance with the present invention can be configured such that the method further includes a sixth step of sealing the electrodes which are exposed from the resin molded body.

According to the configuration, it is possible to manufacture a resin structure inside of which can be protected from water, moisture, and the like.

INDUSTRIAL APPLICABILITY

The present invention is applicable to an electronic device in which a resin structure is used as an exterior component.

REFERENCE SIGNS LIST 1 and 30: resin structure
2: electronic component
3: electrode
4: conductive member
5: resin molded body
6: wiring
7: recess
13: recess bottom surface
20: sheet
23: mold
25: protrusion
50: sealing body

The invention claimed is:

1. A resin structure comprising:
a resin molded body; and
a plurality of electronic components embedded in the resin molded body, wherein
the resin molded body comprises a plurality of exposed surfaces on which electrodes of the plurality of electronic components are exposed,
the plurality of exposed surfaces comprises a resin molded body upper surface and a resin molded body bottom surface of the resin molded body,
the resin molded body comprises a recess provided in the resin molded body bottom surface,
at least some of the plurality of electronic components are exposed from the resin molded body upper surface and from the resin molded body bottom surface inside of the recess.

2. A resin structure as set forth in claim 1, further comprising a wire provided on each of the plurality of exposed surfaces, the wire connecting between the electrodes exposed on the plurality of exposed surfaces.

3. The resin structure as set forth in claim 1, wherein at least one of the electrodes is a multiple-face exposed electrode which is exposed on at least two exposed surfaces that are different from each other,
the resin structure further comprising a wire provided on each of the at least two exposed surfaces, the wire being connected with the multiple-face exposed electrode.

4. The resin structure as set forth in claim 1, wherein only a part of an electronic component whose electrode is exposed on the resin molded body bottom surface of the recess among the plurality of electronic components is exposed on the resin molded body bottom surface.

5. The resin structure as set forth in claim 1, wherein:
the resin molded body is substantially plate-shaped;
one surface of the resin molded body is a flat surface, a whole of which is one of the plurality of exposed surfaces; and
the other surface of the resin molded body has the recess provided thereon.

6. A resin structure as set forth in claim 1, further comprising:
a conductive member embedded in the resin molded body and exposed on at least one of the plurality of exposed surfaces; and
a wire provided on the at least one of the plurality of exposed surfaces, the wire connecting the conductive member with an electrode of an electronic component that is exposed on the at least one of the plurality of exposed surfaces.

7. A resin structure as set forth in claim 1, further comprising:
a conductive member embedded in the resin molded body and exposed on at least two of the plurality of exposed surfaces; and
a wire provided on each of the at least two of the plurality of exposed surfaces, the wire being connected with the conductive member.

8. A resin structure as set forth in claim 1, further comprising a sealing body for sealing the plurality of exposed surfaces.

9. A resin structure comprising:
a resin molded body; and
a plurality of electronic components embedded in the resin molded body,
wherein
the resin molded body comprises a plurality of exposed surfaces on which electrodes of the plurality of electronic components are exposed,
the resin molded body comprises a recess provided therein,
the recess comprises a bottom surface which is at least one of the plurality of exposed surfaces, and
only a part of an electronic component whose electrode is exposed on the bottom surface of the recess among the plurality of electronic components is exposed on the bottom surface.

10. A resin structure comprising:
a resin molded body; and
a plurality of electronic components embedded in the resin molded body,
wherein
the resin molded body comprises a plurality of exposed surfaces on which electrodes of the plurality of electronic components are exposed,
the resin molded body comprises a recess provided therein,
the recess comprises a bottom surface which is at least one of the plurality of exposed surfaces,
a conductive member is embedded in the resin molded body and exposed on at least two of the plurality of exposed surfaces; and
a wire is provided on each of the at least two of the plurality of exposed surfaces, the wire being connected with the conductive member.

* * * * *